US008481171B2

(12) United States Patent
Chong et al.

(10) Patent No.: US 8,481,171 B2
(45) Date of Patent: Jul. 9, 2013

(54) METALLIC LAMINATE AND MANUFACTURING METHOD OF LIGHT EMITTING DIODE PACKAGE USING THE SAME

(75) Inventors: Myung Gun Chong, Gyeongsangnam-do (KR); Cheol Ho Heo, Busan-si (KR); Sang Hyuk Son, Gyeongsangnam-do (KR); Dae Hyung You, Gyeongsangnam-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 546 days.

(21) Appl. No.: 12/690,743

(22) Filed: Jan. 20, 2010

(65) Prior Publication Data

US 2010/0304162 A1    Dec. 2, 2010

(30) Foreign Application Priority Data

May 28, 2009   (KR) .................. 10-2009-0046991

(51) Int. Cl.
  *B32B 15/08*    (2006.01)

(52) U.S. Cl.
  USPC .......... 428/650; 428/654; 428/618; 428/621; 428/624; 428/629

(58) Field of Classification Search
  USPC ............... 428/209, 615, 618, 621, 624, 626, 428/629, 650, 654
  See application file for complete search history.

(56) References Cited

U.S. PATENT DOCUMENTS

| 2,932,599 | A | * | 4/1960 | Dahlgren | 216/20 |
|---|---|---|---|---|---|
| 4,642,161 | A | * | 2/1987 | Akahoshi et al. | 216/35 |
| 4,798,762 | A | * | 1/1989 | Okada et al. | 428/300.7 |
| 5,368,921 | A | * | 11/1994 | Ishii et al. | 442/232 |
| 6,132,589 | A | * | 10/2000 | Ameen et al. | 205/177 |
| 2002/0168528 | A1 | * | 11/2002 | Jonte et al. | 428/418 |
| 2006/0008632 | A1 | * | 1/2006 | Oohori et al. | 428/297.4 |

FOREIGN PATENT DOCUMENTS

| JP | 08-255960 | 10/1996 |
|---|---|---|
| JP | 2000-353827 | 12/2000 |
| JP | 2004-228170 | 8/2004 |
| JP | 2007-317701 | 12/2007 |
| JP | 2008-208183 | 9/2008 |
| JP | 2009-081196 | 4/2009 |
| KR | 10-2007-0039006 A | 4/2007 |
| KR | 10-2009-0033592 A | 4/2009 |

OTHER PUBLICATIONS

Korean Office Action issued in Korean Patent Application No. 10-2009-0046991, dated Dec. 2, 2010.
Japanese Office Action issued in Japanese Patent Application No. 2010-015965, dated Aug. 16, 2011.

* cited by examiner

*Primary Examiner* — Cathy Lam
(74) *Attorney, Agent, or Firm* — McDermott Will & Emery LLP

(57) ABSTRACT

The present invention relates to a metallic laminate and a manufacturing method of a light emitting diode package using the same. The present invention provides a metallic laminate including: a core layer made of an insulating material; a metal layer disposed on one surface of the core layer; a heat radiating metal layer disposed on the other surface of the core layer; and a protective metal oxide layer disposed along an outer surface of the heat radiating metal layer and made of an oxide of the heat radiating metal layer.

2 Claims, 3 Drawing Sheets

METALLIC LAMINATE AND MANUFACTURING METHOD OF LIGHT EMITTING DIODE PACKAGE USING THE SAME

CROSS-REFERENCE TO RELATED APPLICATIONS

This application claims the benefit of Korean Patent Application No. 10-2009-0046991 filed with the Korea Intellectual Property Office on May 28, 2009, the disclosure of which is incorporated herein by reference.

BACKGROUND OF THE INVENTION

1. Field of the Invention

The present invention relates to a metallic laminate and a manufacturing method of a light emitting diode package using the same, and more particularly, to a metallic laminate having a protective metal oxide layer disposed along an outer surface of a heat radiating metal layer and made of an oxide of the heat radiating metal layer, and a manufacturing method of a light emitting diode package using the same.

2. Description of the Related Art

In general, a light emitting diode device is widely used as a light source because of several advantages such as low power consumption and high brightness.

Especially recently, the light emitting diode device is employed as a lighting device and a backlight for a liquid crystal display (LCD). This light emitting diode device is provided in the form of a package which is easily mounted to various devices such as lighting devices.

The light emitting diode package includes a light emitting diode device which is mounted on a printed circuit board. Here, the light emitting diode device generates heat together with light. At this time, the heat generated from the light emitting diode device is radiated through the printed circuit board. However, since the printed circuit board is made of an insulating material having low heat conduction efficiency, the conventional light emitting diode package can't efficiently radiate the heat generated from the light emitting diode device. Therefore, there is a problem of deterioration of life and characteristics of the light emitting diode device.

As one way to solve this problem, there has been proposed a technology of forming a through hole in a printed circuit board of a mounting region of a light emitting diode device and filling the through hole with a heat conductive material, but there are problems of complexity of a manufacturing process and increase of a manufacturing cost.

Accordingly, it is possible to improve heat radiating efficiency and simplify the manufacturing process by directly mounting the light emitting diode package on a package substrate which includes Al with heat radiating effect on a lower surface.

However, in order to prevent corrosion of Al due to chemicals used in a process of forming a circuit pattern, which is electrically connected to the light emitting diode device, on the package substrate, an additional tape should be attached to a surface of Al. At this time, additional process and manpower for attaching and detaching the tape are required, and failure of the package substrate or a process may be caused by pollutants generated due to damage of the tape during the process.

Therefore, in order to achieve heat radiating effect and process simplification, the conventional light emitting diode package includes the package substrate having the Al layer, but there is a problem of increase of failures and the number of processes due to the tape attaching process for protecting Al from the chemicals.

SUMMARY OF THE INVENTION

The present invention has been proposed in order to solve the above-described problems, and it is, therefore, an object of the present invention to provide a metallic laminate having a protective metal oxide layer disposed along an outer surface of a heat radiating metal layer and made of an oxide of the heat radiating metal layer, and a manufacturing method of a light emitting diode package using the same.

In accordance with an aspect of the present invention to achieve the object, there is provided a metallic laminate including: a core layer made of an insulating material; a metal layer disposed on one surface of the core layer; a heat radiating metal layer disposed on the other surface of the core layer; and a protective metal oxide layer disposed along an outer surface of the heat radiating metal layer and made of an oxide of the heat radiating metal layer.

Here, the core layer may further include a heat radiating filler.

Further, the heat radiating metal layer may include aluminum, and the protective metal oxide layer may include an aluminum oxide film.

Further, the metal layer may be made of any one of copper or a copper alloy.

In accordance with another aspect of the present invention to achieve the object, there is provided a manufacturing method of a light emitting diode package including the steps of: preparing a metallic laminate including a core layer made of an insulating material, a metal layer disposed on one surface of the core layer, a heat radiating metal layer disposed on the other surface of the core layer, and a protective metal oxide layer disposed along an outer surface of the heat radiating metal layer and made of an oxide of the heat radiating metal layer; forming a circuit pattern electrically connected to a light emitting diode by patterning the metal layer; and mounting a light emitting diode device on the circuit pattern.

Here, the protective metal oxide layer may be formed by anodizing the surface of the heat radiating metal layer.

Further, the heat radiating metal layer may be made of aluminum, and the protective metal oxide layer may be made of an aluminum oxide film.

Further, the method may further include the step of removing the protective metal oxide layer between the step of forming the circuit pattern and the step of mounting the light emitting diode device.

Further, the core layer may further include a heat radiating filler.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
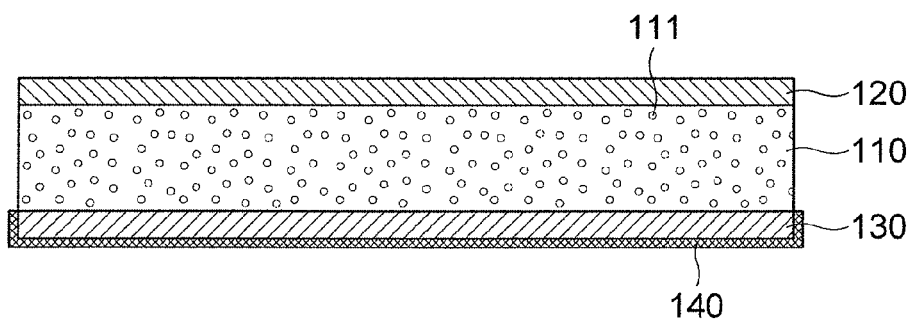
FIG. 1 is a cross-sectional view of a metallic laminate in accordance with a first embodiment of the present invention.

Hereinafter, preferred embodiments of the present invention will be explained in detail with reference to the drawings of a metallic laminate and a light emitting diode package. It should be understood that the following embodiments will be provided as examples to allow those skilled in the art to fully understand the spirit of the present invention. Therefore, the present invention is not limited to the following embodiments but may be embodied in other forms. And, in the drawings, sizes and thicknesses of elements may be exaggerated for convenience. Like reference numerals refer to like elements throughout.

FIG. 1 is a cross-sectional view of a metallic laminate in accordance with a first embodiment of the present invention.

Referring to FIG. 1, a metallic laminate includes a core layer 110, a metal layer 120, a heat radiating metal layer 130, and a protective metal oxide layer 140.

The core layer 110 is made of an insulating material. For example, the core layer 110 may include an epoxy resin or a phenolic resin. Further, the core layer 110 may further include glass fiber to improve durability.

In addition, the core layer 110 further include a heat radiating filler 111. The heat radiating filler 111 is a heat conductive material having high heat conductivity, for example, powder of any one of silver, nickel, copper, aluminum, graphite, ferrite, and carbon. Accordingly, the core layer 110 more efficiently transmits heat from the metal layer 120 to the heat radiating metal layer 130.

The metal layer 120 is disposed on one surface of the core layer 110. The metal layer 120 is a conductive film for forming a circuit pattern. For example, the metal layer 120 may be made of copper or a copper alloy.

The heat radiating metal layer 130 is disposed on the other surface of the core layer 110. The heat radiating metal layer 130 is made of metal having high heat conductivity, for example, aluminum. However, in the embodiment of the present invention, a material of the heat radiating metal layer 130 is not limited.

The protective metal oxide layer 140 is disposed along an outer peripheral surface of the heat radiating metal layer 130. That is, the protective metal oxide layer 140 is formed to cover the surface of the heat radiating metal layer 130, which is exposed to the outside. The protective metal oxide layer 140 plays a role of preventing corrosion of the heat radiating metal layer 130 due to chemicals used in a patterning process of the metal layer 120 or external oxygen or moisture. At this time, the protective metal oxide layer 140 is made of an oxide of the heat radiating metal layer 130. That is, the protective metal oxide layer 140 is formed by surface oxidation of the heat radiating metal layer 130 due to anodizing. For example, in case that the heat radiating metal layer 130 is made of aluminum, the protective metal oxide layer 140 is made of an aluminum oxide. Accordingly, the heat radiating metal layer 130 is formed by an easy process such as surface oxidation.

Therefore, like the embodiment of the present invention, it is possible to improve heat radiating efficiency of a light emitting diode package by forming a circuit board of the light emitting diode package with a substrate having the heat radiating metal layer.

Further, it is possible to prevent the corrosion of the heat radiating metal layer in a process of forming the circuit pattern by further providing the protective metal oxide layer on the surface of the heat radiating metal layer.

Hereinafter, a light emitting diode package manufactured from a metallic laminate in accordance with a first embodiment of the present invention will be described with reference to FIG. 2.

Figure 2:
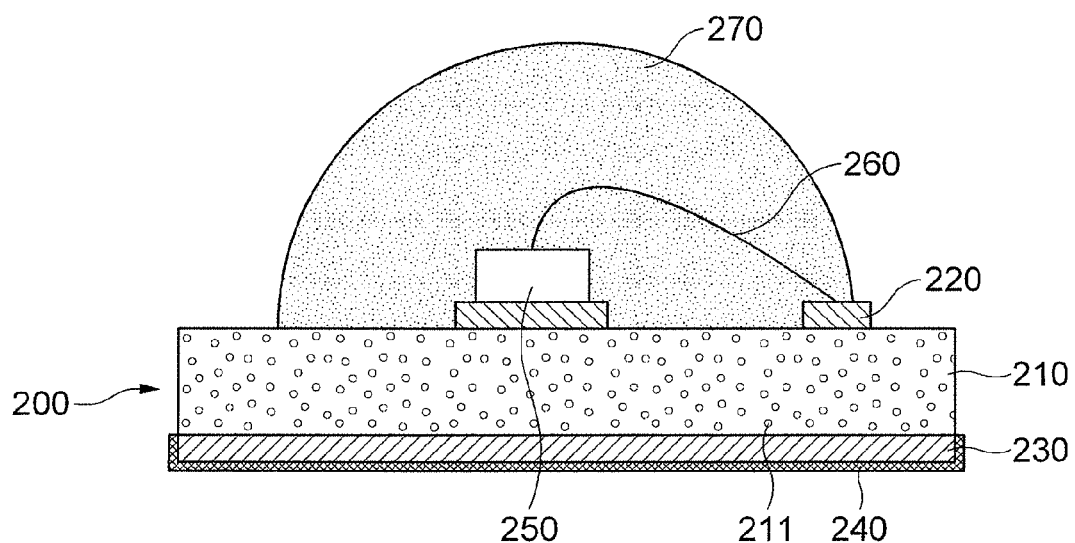
FIG. 2 is a cross-sectional view of a light emitting diode package having a metallic laminate in accordance with a first embodiment of the present invention.

FIG. 2 is a cross-sectional view of a light emitting diode package having a metallic laminate in accordance with a first embodiment of the present invention.

Referring to FIG. 2, a light emitting diode package includes a package substrate 200 and a light emitting diode 250 mounted on the package substrate 200.

The package substrate 200 includes a core layer 210 made of an insulating material, a circuit pattern 220 disposed on an upper surface of the core layer 210, and a heat radiating metal layer 230 disposed on a lower surface of the core layer 210.

The light emitting diode 250 is electrically connected to the circuit pattern 220 and mounted on the package substrate 200 by wire 260 bonding. For example, in case that the light emitting diode 250 is a vertical light emitting diode, a lower surface of the light emitting diode 250 is directly electrically bonded to the circuit pattern 220, and an upper surface of the light emitting diode 250 is electrically bonded to the circuit pattern 220 by the wire 260 bonding. However, in the embodiment of the present invention, a shape of the light emitting diode 250 is not limited, and the light emitting diode 250 may be mounted on the package substrate 200 by flip chip bonding.

The core layer 210 further includes a heat radiating filler 211 for efficiently conducting heat from the circuit pattern 220 to the heat radiating metal layer 230. The heat radiating filler 211 may be heat conductive powder of any one of silver, nickel, copper, aluminum, graphite, ferrite, and carbon.

The heat radiating metal layer 230 plays a role of radiating heat generated from the light emitting diode 250 mounted on the package substrate 200 to the outside.

Accordingly, since the light emitting diode 250 is directly mounted on the package substrate 200 having the heat radiating metal layer 230, it is possible to efficiently radiate the heat to the outside, thereby improving life of the light emitting diode 250 and securing reliability.

In addition, a protective metal oxide layer 240 is disposed along an outer surface of the heat radiating metal layer 230 to protect the heat radiating metal layer 230 in a manufacturing process of the light emitting diode package. The protective metal oxide layer 240 is made of an oxide of metal forming the heat radiating metal layer 230. Accordingly, the protective metal oxide layer 240 is easily manufactured by anodizing the heat radiating metal layer 230.

In the embodiment of the present invention, although it is shown and described that the light emitting diode package includes the protective metal oxide layer 240, the protective metal oxide layer 240 may be removed in a manufacturing completion process of the light emitting diode package.

In addition, the light emitting diode package further includes a molding portion 270 which covers the light emitting diode 250. The molding portion 270 plays a role of protecting the light emitting diode 250 from the outside. The molding portion 270 may be made of a transparent resin, for example, a silicon resin, an epoxy resin, a urethane resin, and an epoxy molding compound. In addition, the molding portion 270 may further include a fluorescent material which converts a wavelength of light emitted from the light emitting diode 250. Accordingly, the molding portion 270 may perform a wavelength conversion function as well as protect the light emitting diode 250.

Therefore, like the embodiment of the present invention, it is possible to easily radiate the heat generated from the light emitting diode to the outside without thickness change of the light emitting diode package or addition of a separate process by forming the package substrate of the light emitting diode package with a metallic laminate having the heat radiating metal layer instead of a printed circuit board.

Hereinafter, a manufacturing method of a light emitting diode package using a metallic laminate in accordance with a first embodiment of the present invention will be described with reference to FIGS. 3 to 6.

Figure 3:
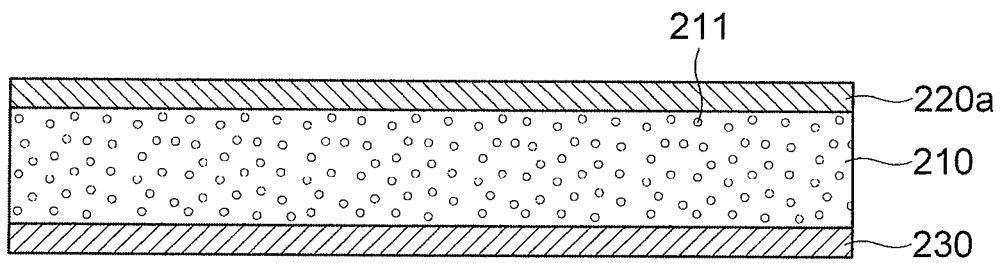
FIGS. 3 to 6 are cross-sectional views for describing a manufacturing method of a light emitting diode package in accordance with a second embodiment of the present invention.

FIGS. 3 to 6 are cross-sectional views for describing a manufacturing method of a light emitting diode package in accordance with a second embodiment of the present invention Referring to FIG. 3, in order to manufacture a light emitting diode package, first, a metallic laminate is formed.

In order to manufacture the metallic laminate, a core layer 210 made of an insulating material is provided. The core layer 210 may include an epoxy resin or a phenolic resin. Further, the core layer 210 may further include glass fiber to improve durability. Further, the core layer further includes a heat radiating filler 211 to improve heat radiating effect of the metallic laminate. For example, the heat radiating filler 211 may be made of silver, nickel, copper, aluminum, graphite, ferrite, or carbon.

The metal laminate is formed by respectively stacking a metal layer 220a and a heat radiating metal layer 230 on both surfaces of the core layer 210 and heating and pressing them.

The metal layer 220a is made of a conductive material, for example, copper or a copper alloy.

Further, the heat radiating metal layer 230 is made of a material having higher heat conductivity than other materials, for example, aluminum or an aluminum alloy.

Figure 4:
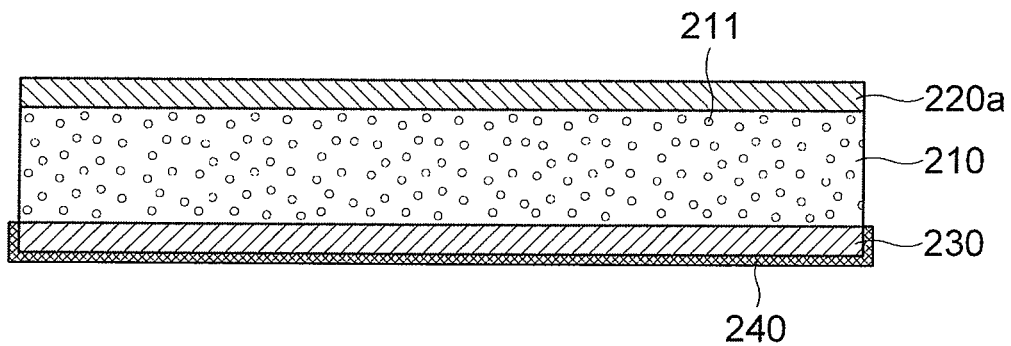

Referring to FIG. 4, a protective metal oxide layer 240 is formed along an outer surface of the heat radiating metal layer 230. That is, the protective metal oxide layer 240 is formed on the surface of the heat radiating metal layer 230, which is exposed to the outside. The protective metal oxide layer 240 plays a role of preventing corrosion of the heat radiating metal layer 230 due to chemicals used in a patterning process of the metal layer 220a.

The protective metal oxide layer 240 is made of an oxide of metal forming the heat radiating metal layer 230. For example, in case that the heat radiating metal layer 230 is made of aluminum, the protective metal oxide layer 240 is made of an aluminum oxide.

At this time, the protective metal oxide layer 240 is formed by anodizing the heat radiating metal layer 230. Here, for example, the anodizing method may be a sulfuric acid method, a hydrofluoric acid method, or an organic acid method.

Accordingly, since additional process and manpower for attaching a protective tape to protect the heat radiating metal layer 230 are not required, it is possible to reduce the number of processes and a process cost and to protect the surface of the heat radiating metal layer 230.

Figure 5:
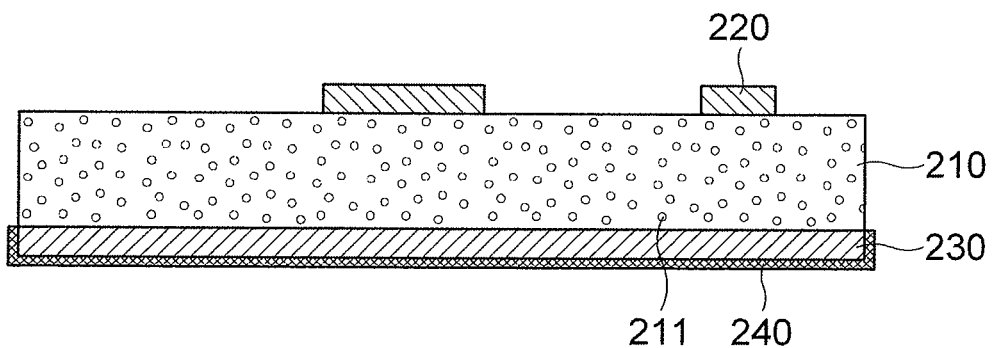

Referring to FIG. 5, a circuit pattern 220 is formed by etching the metal layer 220a. At this time, the protective metal oxide layer 240 protects the surface of the heat radiating metal layer 230 from chemicals used in a process of forming the circuit pattern 220.

Figure 6:
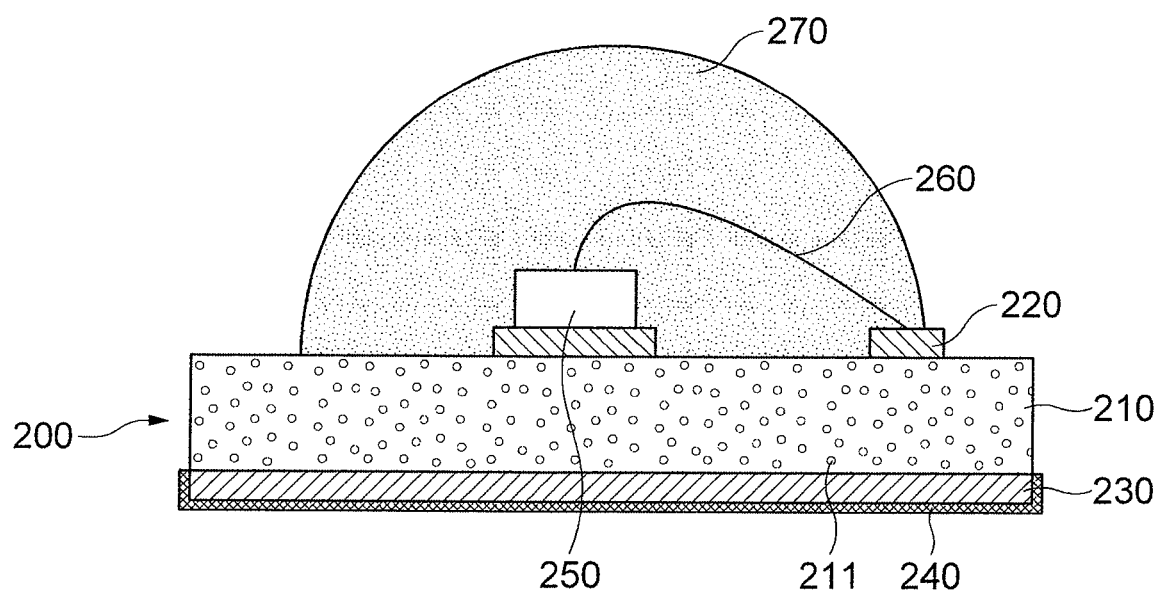

Referring to FIG. 6, a light emitting diode 250 is mounted to be electrically connected to the circuit pattern 220. Here, the light emitting diode 250 is mounted by a wire 260 bonding method or a flip chip bonding method, and it is not limited in the embodiment of the present invention.

After that, a molding portion 260 is formed to cover the light emitting diode 250. The molding portion 260 may be made of a silicon resin, an epoxy resin, a urethane resin, or an epoxy molding compound. In addition, the molding portion 260 may further include a fluorescent material for converting light generated from the light emitting diode 250. Here, for example, the molding portion 260 may be formed in a desired shape by a casting mold method, a dispensing method, an injection molding method, a transfer molding method, or a pin gate molding method.

In addition, a process of removing the protective metal oxide layer 240 by a wet method may be further performed.

Accordingly, like the embodiment of the present invention, it is possible to improve heat radiating efficiency of the light emitting diode package and to manufacture the light emitting diode package through an easy manufacturing process by forming a package substrate with the metallic laminate having high heat conductivity.

Further, it is possible to prevent deterioration of the heat radiating efficiency by protecting the surface of the heat radiating metal layer of the metallic laminate with the protective metal oxide layer.

Further, it is possible to prevent increase of a process cost without purchasing subsidiary materials by easily forming the protective metal oxide layer with the anodizing method of the heat radiating metal layer.

The present invention manufactures the light emitting diode package having high heat radiating efficiency through the easy process by forming the package substrate with the metallic laminate having the metal layer, the core layer, and the heat radiating metal layer.

Further, it is possible to protect the heat radiating metal layer from the chemicals used in the process of forming the circuit pattern by forming the protective metal oxide layer on the outer surface of the heat radiating metal layer.

Further, it is possible to easily form the protective metal oxide layer by anodizing the heat radiating metal layer.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A metallic laminate, comprising:
   a core layer made of an insulating material and including a heat radiating filler;
   a metal layer disposed on a first surface of the core layer;
   a heat radiating metal layer disposed on a second surface of the core layer; and
   a protective metal oxide layer disposed over the entirety of outer exposed surfaces of the heat radiating metal layer and made of an oxide of the heat radiating metal layer, such that corrosion of the heat radiating metal layer is prevented, wherein:
   the heat radiating metal layer includes aluminum, and
   the protective metal oxide layer includes an aluminum oxide film.

2. The metallic laminate according to claim 1, wherein the metal layer is made of copper or a copper alloy.

* * * * *